United States Patent [19]
Rostamy et al.

[11] Patent Number: 5,970,399
[45] Date of Patent: Oct. 19, 1999

[54] RADIO CHANNEL SQUELCHING SYSTEMS

[75] Inventors: Jafar Rostamy, Solna; Johan von Perner, Täby; Anders Engman, Stockholm, all of Sweden

[73] Assignee: Telefonaktiebolaget LM Ericsson, Stockholm, Sweden

[21] Appl. No.: 08/562,085

[22] Filed: Nov. 22, 1995

[51] Int. Cl.$^6$ ..................................................... H04B 1/10
[52] U.S. Cl. ........................ 455/222; 455/212; 455/218
[58] Field of Search ................................. 455/212, 218, 455/222, 223, 224, 118, 131, 225, 219, 221, 315, 316; 375/351

[56] References Cited

U.S. PATENT DOCUMENTS

| | | | |
|---|---|---|---|
| 4,025,853 | 5/1977 | Addeo | 325/55 |
| 4,245,348 | 1/1981 | Imazeki | 455/212 |
| 4,371,981 | 2/1983 | King et al. | 455/219 |
| 4,388,731 | 6/1983 | King | 455/221 |
| 4,479,252 | 10/1984 | Souchay et al. | 455/223 |
| 4,541,118 | 9/1985 | Eastmond et al. | 455/212 |
| 4,547,902 | 10/1985 | Kasperkovitz | 455/218 |
| 4,724,545 | 2/1988 | Hamada | 455/218 |
| 4,922,549 | 5/1990 | Johnson et al. | 455/212 |
| 5,014,343 | 5/1991 | Place | 455/218 |
| 5,036,543 | 7/1991 | Ueno | 455/222 |
| 5,146,610 | 9/1992 | Longshore et al. | 455/218 |
| 5,204,973 | 4/1993 | Sugayama | 455/212 |
| 5,212,817 | 5/1993 | Atkinson | 455/161.2 |
| 5,408,693 | 4/1995 | Alton et al. | 455/212 |
| 5,410,741 | 4/1995 | Cahill et al. | 455/69 |
| 5,473,615 | 12/1995 | Boyer et al. | 455/218 |
| 5,812,940 | 9/1998 | Lindell | 455/114 |

*Primary Examiner*—Vu Le
*Attorney, Agent, or Firm*—Burns, Doane, Swecker & Mathis, L.L.P.

[57] ABSTRACT

Detection of in-band noise in a radio communications voice channel is provided by mixing a signal having a known frequency into a radio signal containing a voice channel signal in an in-band range, thereby translating the voice channel signal out of the in-band range. The in-band range is thereafter examined for the presence of noise signal energy whose presence can be indicative of in-band noise. Squelching of the voice channel is provided in the event that in-band noise energy exceeds a predetermined threshold.

13 Claims, 6 Drawing Sheets

RADIO CHANNEL SQUELCHING SYSTEMS

RELATED APPLICATIONS

The following patent applications are related to the present application: U.S. patent application Ser. No. 08/561,055, entitled "Supervisory Audio Tone Detection Using Digital Signal Processing" to Omar Ryde et al. and U.S. patent application Ser. No. 08/561,848 entitled "Signal-to-Noise Ratio Determination Using Digital Signal Processing" to Omar Ryde et al., both of which applications were filed on the same date as the present application. The disclosures of these related applications are expressly incorporated here by reference.

BACKGROUND

The present invention is directed generally to muting a radio channel in a radiocommunications system and, more particularly, to methods and apparatus for selectively squelching a radio channel based on a detection of in-band noise.

The first cellular mobile radio systems in public use were analog systems for conveyance of speech or other analog information. These systems utilized multiple radio channels to communicate analog information between base and mobile stations by transmitting analog-modulated radio signals. One such system is known as the Nordic Mobile Telephone system NMT 450. Another known analog cellular mobile radio system, of particular interest as background to the present invention, is the Advanced Mobile Phone Service (AMPS) mobile radio system utilized in the U.S.A. In general, these systems provide a squelching system which relies on the detection of noise in order to determine whether squelching is to be applied.

Recently, digital cellular mobile radio systems for public use have been designed. Digital cellular mobile radio systems provide digital radio channels for transmitting digital or digitized analog information between base and mobile stations using digitally modulated radio signals. Digital cellular mobile radio systems may offer substantial advantages, e.g. greater system capacity per unit bandwidth, over analog cellular mobile radio systems.

In contrast to the introduction of digital-only cellular mobile radio systems, like the GSM system employed in parts of Europe, in areas with existing analog cellular systems it has been proposed to introduce digital cellular mobile radio systems which are designed to cooperate with the existing analog cellular mobile radio systems. In this way large legacy customer bases will not suddenly find that their terminal equipment has become obsolete. System designers of these hybrid systems believe that the digital portion of the system can be gradually introduced and, over time, the number of digital channels can be gradually increased, while the number of analog channels is gradually decreased. In order to provide complete compatibility, such dual-mode systems should comport with adopted standards for both analog and digital formats, such as the AMPS standard.

In cellular mobile radio systems it is desirable to provide a communications channel that is generally free of noise or interference, or in the event that such noise or interference is found, to mute the radio channel to enhance the perceived audio quality of a signal transmitted over the radio channel. It is also desirous that a mobile station with an established connection on a radio channel be able to maintain audio quality when moving within the same cell, or between cells, even if the radio channel being used is subject to increased interference. If the quality of the established connection falls below specified parameters it is further desirable to automatically mute, or squelch the radio channel momentarily, and then to restore the transmitted signal when the quality of the connection returns to an acceptable level. This practice avoids the perception of diminished audio quality.

The AMPS system provides a noise squelching technique whereby a radio channel is momentarily muted when a substantial amount of out-of-band noise is detected, and then restores the radio signal when the out-of-band noise level drops below a predetermined threshold. A voice, or information signal, normally occupies the 0–3 kHz frequency band (the "in-band" frequency range). The AMPS system monitors a higher (out-band) frequency range, in accordance with a known principle, wherein the detection of a sufficient amount of noise energy in this higher frequency range is believed to be indicative of noise, or interference in the in-band radio channel (hereinafter referred to as the "voice channel"). More specifically, the aforementioned conventional system operates in accordance with a known principle wherein a measurement of noise energy in the 17 kHz to 71 kHz bandwidth is considered determinative of whether there is noise or interference in the 0–3 kHz in-band voice channel. If a sufficient amount of noise energy is detected in the 17 kHz–71 kHz frequency band, it is assumed that voice channel interference is present, and that the voice channel should be squelched to preserve perceived audio quality.

Although dual-mode base stations and mobile stations continue to support analog system functions, such as squelching, the techniques by which these functions are supported are continuously being improved to reduce costs and improve quality. With the increased power of digital signal processors (DSPs), system designers are interested in implementing many signal processing techniques previously implemented using analog hardware components as DSP routines. DSP implementation has the added attraction of reducing the number of components, and hence the size, of base stations and mobile stations.

Of course, digital signal processing also has its limitations. One design tradeoff which system designers confront when trying to implement analog signal processing techniques as DSP routines is that of speed of execution of a routine versus the amount of DSP resources, e.g., the number of millions of instructions per second (MIPS), which are allocated to execute a given routine. Since digital signal processors are not yet sufficiently inexpensive or quick that the number of MIPS used for each routine are insignificant, system designers are called upon to develop innovative digital signal processing techniques that reduce the number of MIPS used so that a digital signal processor can handle as many tasks as possible.

For instance, the aforementioned squelching function in the analog domain examines noise energy in a 17 kHz–71 kHz range. However, a conventional DSP would have to devote a large amount of resources, i.e., MIPS, to the evaluation of signals in this range due, in part, to the high sampling rate required to sample such signals. For example, at least 80 MIPS would typically be required for processing signals in this frequency range.

Furthermore, Applicants recognize that signal energies present in the 17 kHz–71 kHz range may not necessarily be indicative of noise or interference. Non-noise co-channel signals, adjacent, or side band signals also may operate in, and consequently contribute energy to, the 17 kHz–71 kHz frequency band. Detection of energy from such signals may result in a false indication of noise, and the inadvertent invocation of voice channel squelching.

Consequently, direct application of digital signal processing to perform conventional noise squelching in radiocommunication systems is susceptible to erroneous noise indications. Furthermore, inordinate processing resources are required to sample the frequency band traditionally investigated for indications of in-band noise. Accordingly, new techniques are desirable for determining when to squelch a radio channel in radiocommunication systems.

SUMMARY

These and other drawbacks and limitations of conventional methods and techniques for squelching a voice channel in a hybrid system, for example, are provided according to the present invention. Exemplary embodiments provide squelching by mixing a known signal into a radio signal channel and then checking an in-band frequency range of the resulting signal for noise. That is, after mixing in the known signal, whereby a voice channel signal is shifted, or translated up the frequency spectrum (into out-band ranges) in accordance with known principles of frequency multiplication, the in-band frequency range is then examined for noise. Checking for noise energy in any bandwidth in the in-band frequency range provides an accurate indication of whether noise is present in the voice channel. If sufficient noise is found, then the voice channel is squelched. If little or no noise is found, the voice channel signal is provided for output. When the noise level of a squelched voice channel drops below a predetermined level, squelching is removed and the voice channel signal is restored for output. Detecting noise in the in-band range is more accurate than relying on conventional out-band noise determination for making an assumption of in-band noise. Furthermore, DSP noise detection in the relatively low in-band frequency range consumes less DSP resources, and is therefore feasible using conventional DSPs.

BRIEF DESCRIPTION OF THE DRAWINGS

The foregoing, and other, objects, features and advantages of the present invention will be more readily understood upon reading the following detailed description in conjunction with the drawings in which.

DETAILED DESCRIPTION

Figure 1:
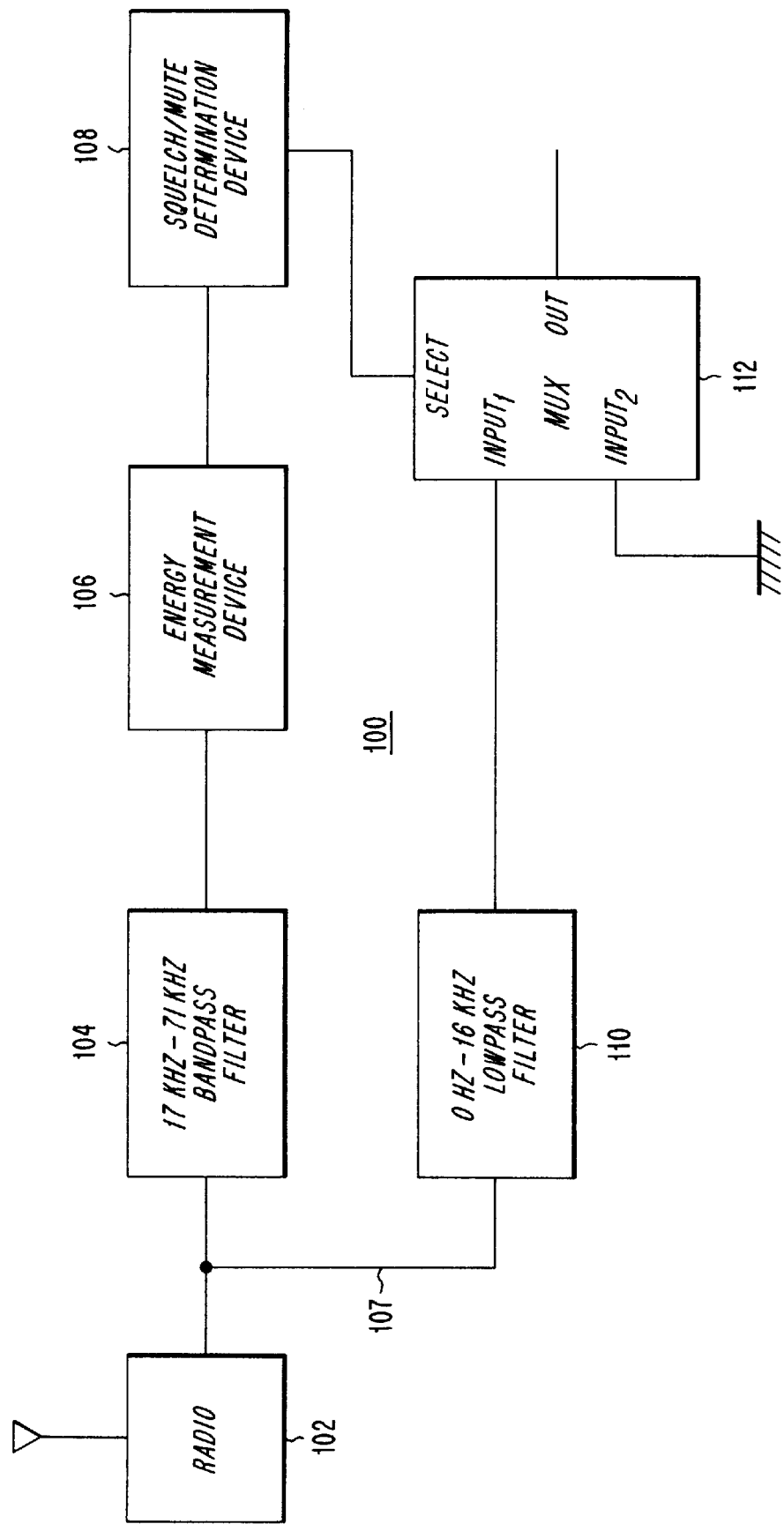
FIG. 1 is a block diagram illustrating a conventional squelching circuit.

An analog squelching circuit in accordance with a conventional arrangement is shown in FIG. 1. A radio unit 102, which can be incorporated as part of a radio base station in a radiocommunication system, transmits and receives signals to and from mobile units (not shown). Signals received by the radio unit 102 contain speech or information signals in a voice channel. This voice channel also may contain noise. In order to make a voice channel noise determination in accordance with the known technique described above, a signal received by the radio unit 102 is first filtered through a band pass filter 104. The band pass filter 104 allows signals having a frequency of between 17 kHz and 71 kHz to pass. Energy from signals in this frequency range is measured by an energy measurement device 106. The energy measurement device 106 provides a signal to a squelch/mute determination device 108. The squelch determination device 108 compares the energy measurement signal with a predetermined threshold, i.e., how much out-band noise is acceptable, and outputs a control signal which is received by a select port of a multiplexor 112. The multiplexor 112 has a first and a second input port (input$_1$, input$_2$), and an output port. The value of the signal received by the select port of the multiplexor 112 determines whether the signal on the first input port (input$_1$), or the second input port (input$_2$) is output at the output port.

The signal output by radio unit 102 also is provided to a low pass filter 110 which allows signals having frequencies of between 0 and 16 kilohertz to pass. Output from low pass filter 110 is provided to the first input port (input$_1$) of the multiplexor 112. The second input port (input$_2$) of the multiplexor 112 is grounded. The output of either the first input or the second input from the multiplexor device is determined by the signal provided by the squelching determination device 108 to the selection port of the multiplexor 112. If a sufficient amount of energy is measured by the energy measurement device 106 to indicate the presence of an intolerable amount of noise on the voice channel, the squelch/mute determination device 108 signals the multiplexor 112 to select the second (grounded) input port of the multiplexor 112 for output. Because it is grounded, selection of the second input port provides the squelching function, silencing the voice channel output. In the event that the energy measurement device 106 measures less than a predetermined amount of noise energy in the 17 kHz to 71 kHz band, the squelch/mute determination device 108 sends a control signal to the multiplexor 112 indicating that the first input port (input$_1$) is selected, thus providing the voice channel (filtered through low pass filter 110) for output.

Operation in accordance with the present invention involves the use of digital signal processing to determine the presence of noise in the voice channel. The use of digital signal processing for the conventional technique involving investigation of the 17 kHz–71 kHz frequency range is DSP resource (MIPS) intensive and inefficient. Systems operating in accordance with the present invention mix a signal having a frequency which has already been used to modulate the voice signal carrier, e.g., the SAT frequency, with the voice channel signal in order to translate the voice channel up the frequency spectrum out of the in-band range after which the in-band range is examined for the presence of noise.

Figure 2:
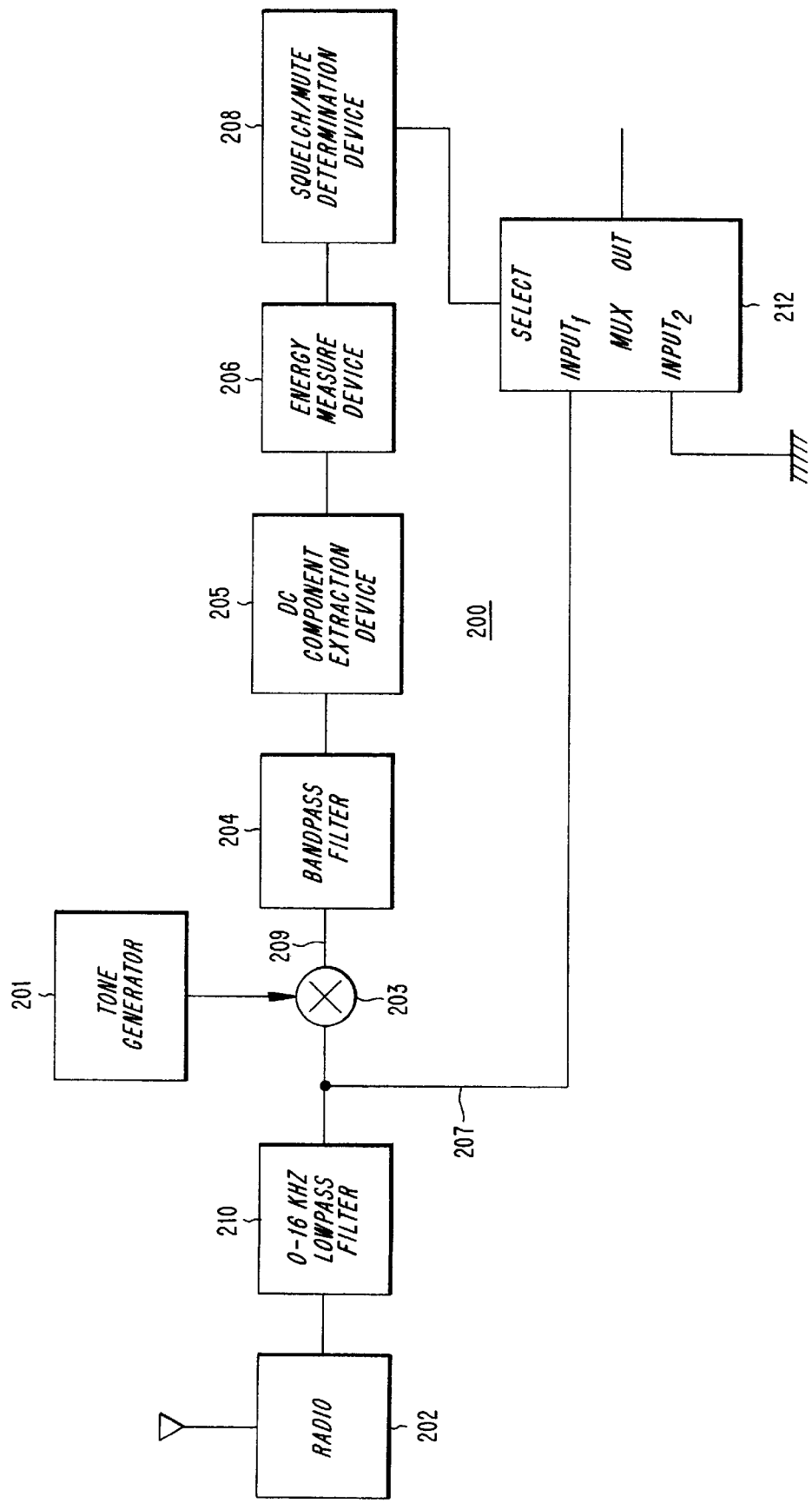
FIG. 2 is a block diagram illustrating an exemplary squelching circuit in accordance with an exemplary embodiment of the present invention.

A squelching circuit 200 in accordance with an exemplary embodiment of the invention is shown in FIG. 2. A signal received by radio unit 202 in the base station is provided to a low pass filter 210 which allows signals having a frequency of 0–16 kHz to pass. The filter output 207 from the low pass filter 210 is provided to an input port of a mixer 203. A tone generator 201 provides a signal at the SAT frequency associated with that base station to another input port of the mixer 203. The mixer 203 combines the filter output 207 with the signal from the tone generator to produce a mixed signal 209. The mixed signal 209 is provided to a band pass filter 204. A DC component is removed, if necessary (depending on the particular pass band selected), from the output of the band pass filter 204 by a DC component extraction device 205. The energy of the resulting signal is measured by an energy measurement device 206. Output from the energy measurement device 206 is provided to a squelching determination device 208 which determines if there is sufficient noise energy to justify squelching. As described with respect to FIG. 1, the output of the squelching determination device is provided to a selection port of a multiplexor 212 to determine whether the first input port (voice signal) or second input port (squelching) is output by the multiplexor 212. As described with respect to FIG. 1, output from the radio unit 202 is provided to the first input port (input$_1$) of the multiplexor 212. The second input port (input$_2$) of the multiplexor 212 is grounded or, in the alternative, provided with binary zeros, in order to provide the squelching function.

In accordance with systems incorporating the present invention, the known tone or signal mixed into the received voice channel signal at block 203 is selected so as to translate the voice channel signal out of the in-band frequency range. That is, translate the voice channel signal out of the 0–3 kHz range. In accordance with an exemplary embodiment of the invention, the signal having a known frequency generated by the tone generator 201, is the supervisory audio tone (SAT). The SAT is used by the mobile station to modulate the voice channel signal prior to transmission to provide channel control functions.

In AMPS and IS-54B, the SAT is transmitted on analog communication channels. More specifically, a base station transmits a SAT to a mobile station which detects the SAT and transponds the tone back to the base station to close the loop by modulating the voice channel carrier with a signal at the SAT frequency which was detected by the mobile. Three SAT frequencies are specified in AMPS and IS-54, at 5970 Hz, 6000 Hz and 6030 Hz. Adjacent base stations use different SAT frequencies. The reason for transmitting the SAT in AMPS is that, in an interference-limited mobile radiocommunication network, there should be some mechanism for the receiving entity (e.g., a base station), to identify the transmitting entity (e.g., a mobile station) or at least with high likelihood exclude interchange of transmitter entities without the need for continuous transmission of a transmitter identity. Thus, the base station expects to receive the same SAT that it sent out, i.e., on the same frequency.

Figure 3:
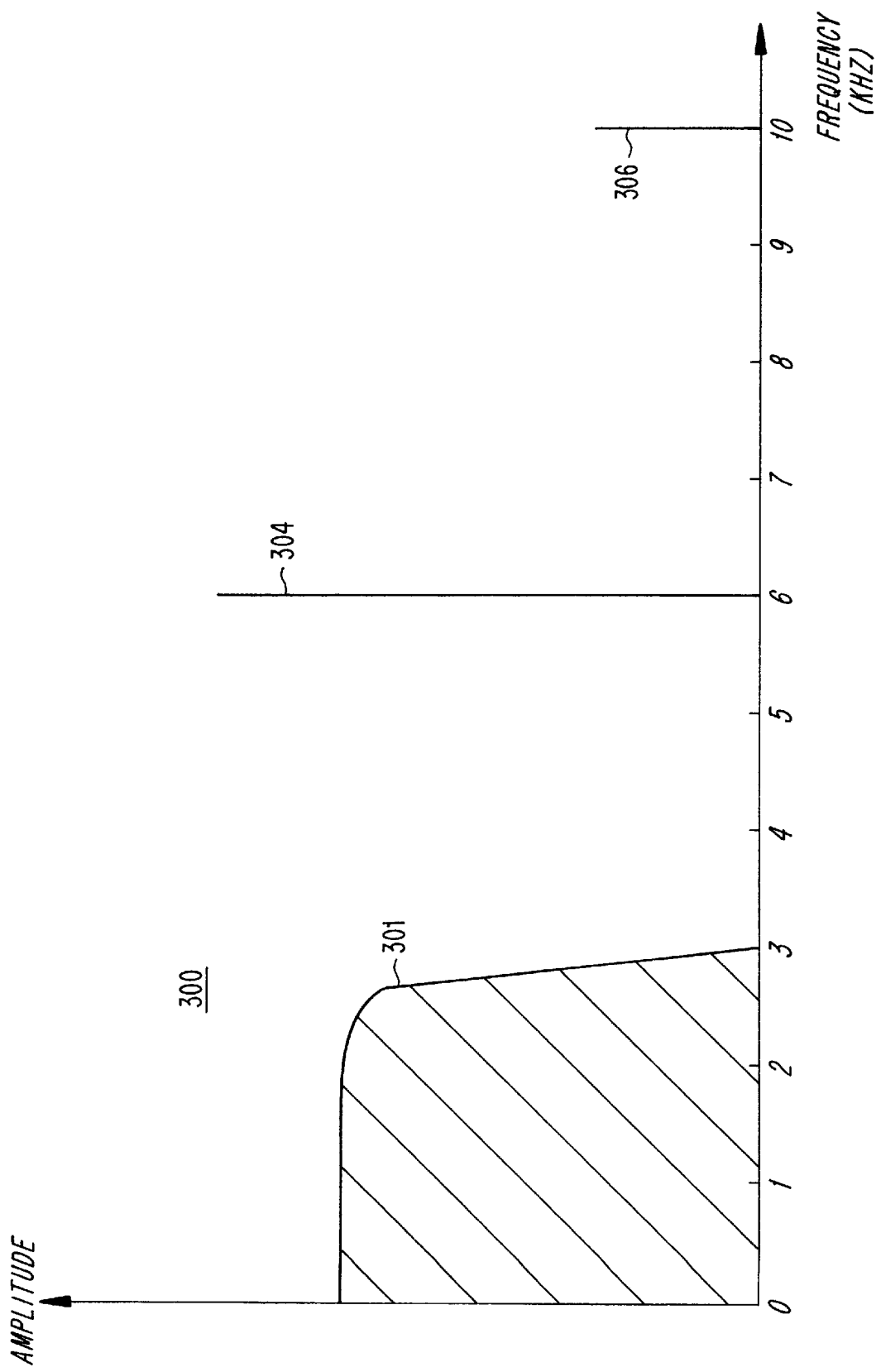
FIG. 3 is a graph depicting the 0 to 10 kHz spectrum of a radio signal received by a radio receiver.

A graph 300 depicting the spectrum of exemplary signals found on signal lines 107 and 207 is shown in FIG. 3. The voice signal spectrum 301 ordinarily appears between the frequencies of 0 and 3 kHz. The SAT 304 and Signaling Tone 306 are depicted at about 6 kHz and about 10 kHz, respectively. The 10 kHz Signaling Tone 306 is indicative of, for example, call hang-up or answer. In accordance with a preferred embodiment of the invention, the tone selected for mixing with the filter output 207 is the SAT since this known frequency has already been used to modulate the data signal in the mobile station and will result in a desired translation of the voice signal. Although, as mentioned above, SATs in AMPS and IS-54 compatible systems may have frequencies of 5.97, 6.00 or 6.03 kHz, a 6 kHz SAT has been selected here to describe the principles of the present invention.

Figure 4:
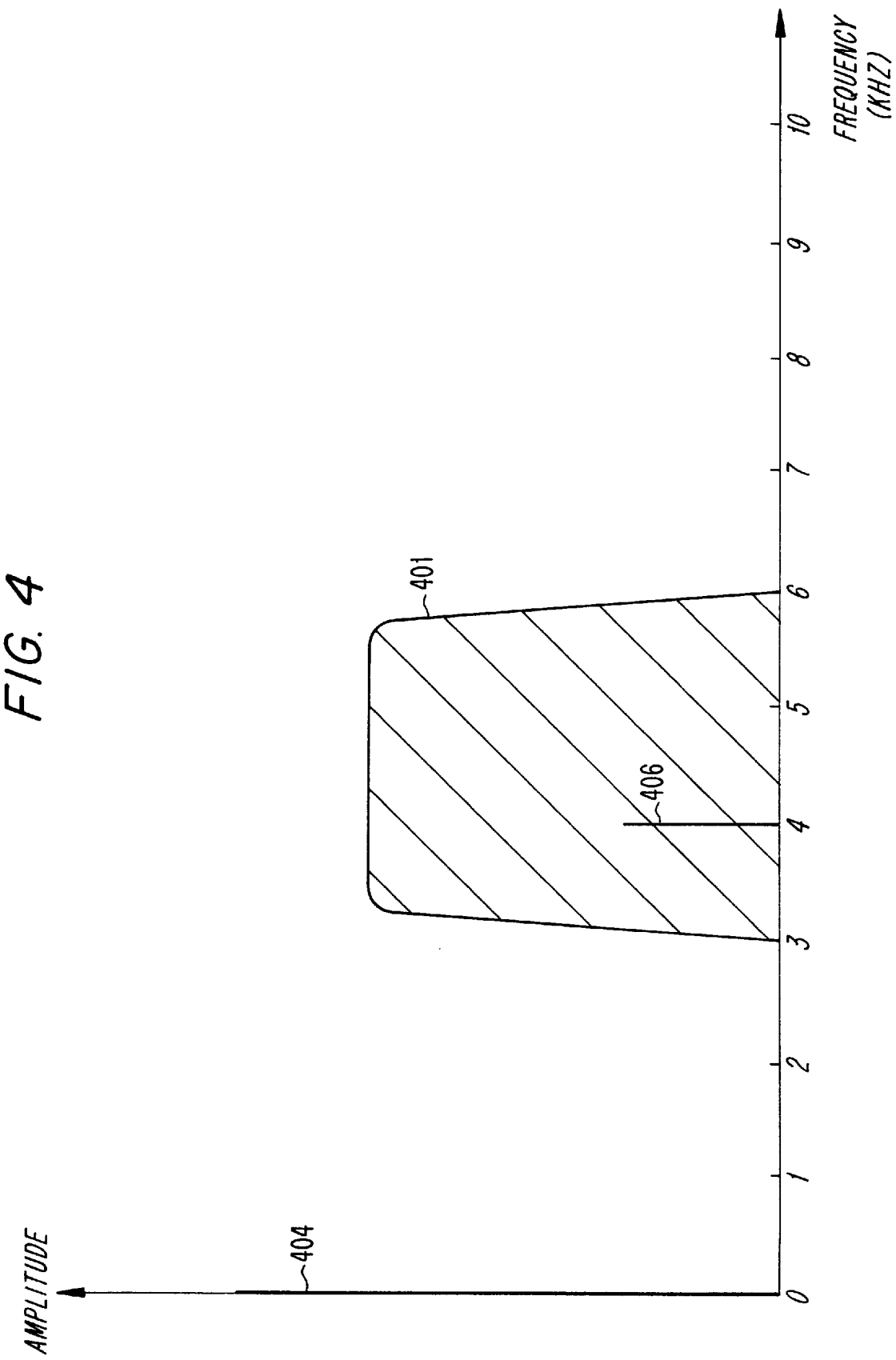
FIG. 4 is a graph depicting the 0 to 10 kHz spectrum of a radio signal received by a radio receiver and mixed with a 6 kHz SAT in accordance with an exemplary embodiment of the invention.

FIG. 4 illustrates the spectrum of the mixed signal 209 that is produced as a result of mixing the filter output signal 207 with the known SAT, e.g., a 6 kHz signal (produced by the tone generator 201). As will be appreciated by those skilled in the art, the multiplication of the filter output 207 (whose spectrum is depicted in FIG. 3) by a 6 kHz (from e.g., tone generator 201) signal results in a mixed signal 209 whose spectrum appears in FIG. 4. In FIG. 4 it is noted that the voice signal 401 is translated to the 3 kHz–6 kHz range, and translated SAT 404 and Signaling Tone 406 appear at 0 and 4 kHz, respectively. Hence, except for the DC component, which is removed in accordance with preferred embodiments, the in-band range is devoid of the information signal and can now be checked for the appearance of noise or interference.

In an exemplary embodiment, the bandpass filter 204 is a lowpass filter that allows noise signals having a frequency of 0 to 100 Hz to pass. Signals in the 0–100 Hz frequency range can be easily sampled using a minimum of DSP resources (i.e., a relatively low sampling rate is needed to sample in this range). In accordance with the exemplary embodiment depicted, the 0 Hz translated SAT 404 is removed by the DC component extraction device 205 prior to the noise energy measurement. A measurement of the noise energy is made for the selected in-band range and squelching applied, if necessary, in the manner previously described. It will be appreciated that any in-band frequency range may be examined for noise. For example, one could measure signals within a spectrum of 0–2.9 kHz. Alternatively, only 100 or 200 Hz band within the in-band frequency range could be checked for noise energy. It will be further appreciated that any of a noise energy, or power level within a selected band may be measured and compared.

Figure 5:
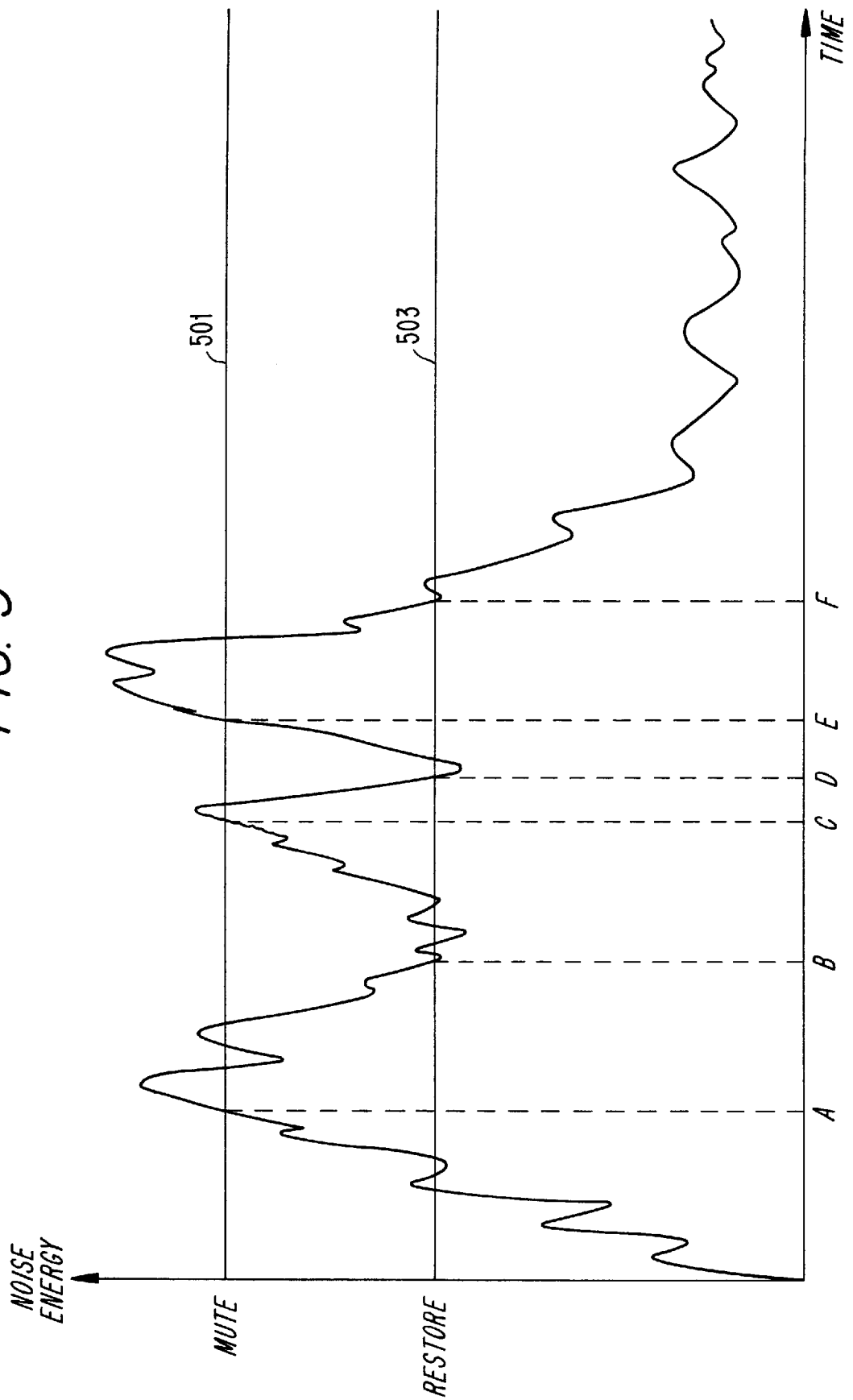
FIG. 5 is a graph displaying muting thresholds in accordance with another aspect of the present invention.

The determination of whether to invoke squelching is made by the squelch/mute determination device 208, or like means. In an exemplary embodiment of the invention, this device monitors the energy level of the signal extracted by the band pass filter 204, less any DC component (if necessary). Further in accordance with preferred embodiments of the invention, a dual threshold scenario is used to invoke squelching and to restore the voice channel signal. This is illustrated in the graph depicted in FIG. 5. The squelch/mute device 208 will output a signal to mute the output when the noise energy exceeds the "MUTE" threshold 501. Hence, the output is squelched at, for example, times A, C, and E. Output of the voice channel signal is restored when the noise energy falls below the "RESTORE" threshold 303, for example, at time points indicated by B, D, and F. Hence, the voice channel is squelched at the time periods between A and B, C and D, and E and F. Using a dual threshold such as that illustrated in FIG. 5 avoids rapid squelching/restoring that can occur when using a single threshold. Perceived audio quality can deteriorate when a noise level hovers around the single threshold, repeatedly rising above and falling below the threshold.

Figure 6:
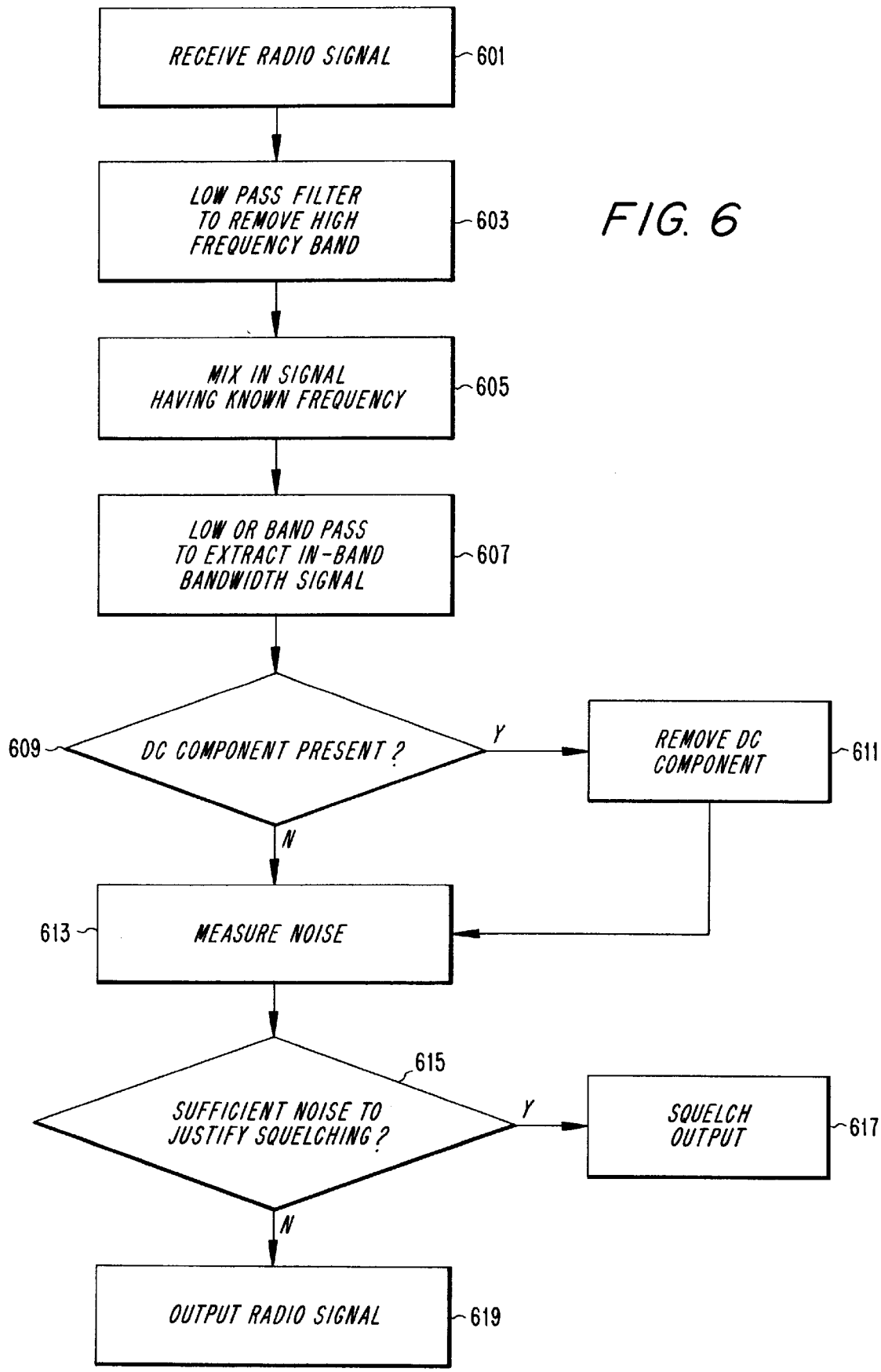
FIG. 6 depicts a flow diagram in accordance with an exemplary embodiment of the present invention.

A method of operating a system in accordance with an exemplary embodiment of the invention is illustrated in the flow diagram appearing in FIG. 6. The method involves receiving a signal from a radio receiver, or transceiver (block 601). High frequency signals are filtered out to produce the filtered signal (e.g., signal 207) containing the in-band voice or information channel signal (0–3 kHz), and any desirable information signals that may appear in a higher (e.g., 3 kHz–16 kHz) range (block 603). A signal having a known frequency that has been earlier used to modulate the received data signal is then mixed in with the filtered signal at block 605 to produce a mixed signal wherein the voice channel information is translated, or shifted, out of the in-band range. The mixed signal is then passed through a band pass or low pass filter at block 607 to extract a noise determination bandwidth in the in-band range. A DC component is removed, if necessary, from the extracted bandwidth at blocks 609, 611. The extent of any noise appearing in the extracted bandwidth signal is determined at block 613. The determination is provided to a decision block 615 whose output determines whether the radio signal is output (block 619) or whether the radio channel is squelched (block 617).

The above-described exemplary embodiments are intended to be illustrative in all respects, rather than restrictive, of the present invention. Thus the present invention is capable of many variations in detailed implementation that can be derived from the description contained herein by a person skilled in the art. All such variations and modifications are considered to be within the scope and spirit of the present invention as defined by the following claims.

What is claimed:

1. An apparatus for squelching a radio signal having an in-band frequency range, the apparatus comprising:

means for receiving the radio signal;

means for mixing a first signal having a known frequency with the radio signal to produce a second signal, the known frequency being selected so that signals from the in-band frequency range are translated out of the in-band frequency range;

means for determining if a parameter in said in-band frequency range exceeds a first predetermined threshold; and means for receiving the radio signal and selectively squelching the radio signal based upon an output of said determining means.

2. The apparatus as claimed in claim 1, wherein the determining means includes a measurement device which measures one of energy, power or level of said in-band frequency range of said second signal.

3. The apparatus as claimed in claim 1, wherein the radio signal contains a voice channel signal disposed in the in-band frequency range.

4. The apparatus as claimed in claim 1, wherein the first signal is a supervisory audio tone.

5. The apparatus as claimed in claim 1, further comprising:

means for comparing said parameter to a second predetermined threshold and selectively restoring the radio signal based on said comparison.

6. The apparatus as claimed in claim 1, further comprising:

means for removing a DC component from the in-band frequency range of the second signal.

7. The apparatus as claimed in claim 1, further comprising:

a low pass or a band pass filter for extracting a frequency range of said second signal within said in-band frequency range for processing in said determining means.

8. The apparatus as claimed in claim 7, wherein said frequency range is 0–100 Hz.

9. The apparatus as claimed in claim 5, wherein the squelching means comprises a multiplexor having a first input port connected to ground and a second input which receives the radio signal.

10. The apparatus as claimed in claim 1, further comprising:

a band pass filter for filtering the radio signal received by the receiving means.

11. A method for squelching a radio signal having an in-band frequency range, the method comprising the steps of:

receiving the radio signal;

mixing a first signal having a known frequency with the radio signal to obtain a second signal, the known frequency being selected so that signals from the in-band frequency range are translated out of the in-band frequency range;

measuring an amount of noise energy found in the in-band frequency range;

comparing the amount of noise energy measured to a predetermined threshold; and squelching the radio signal if the measured noise energy is greater than or equal to the predetermined threshold.

12. A method for squelching a radio communications channel, the method comprising the steps of:

receiving a radio signal;

mixing a first signal with the radio signal to obtain a second signal;

determining an amount of noise in a bandwidth below a desired, information bearing portion of the second signal;

comparing the amount of noise determined to a predetermined threshold; and squelching the radio communications channel if the amount of noise determined is greater than or equal to the predetermined threshold.

13. A base station comprising:

a receiver for receiving a radio signal;

a tone generator for providing a tone signal at a SAT frequency of said base station;

a mixer for multiplying the radio signal with the tone signal to produce a mixed signal wherein a voice channel within said radio signal is translated to a higher frequency;

a noise measurement device for measuring noise present in a bandwidth below said higher frequency; and a squelching determination device for squelching the radio channel if the noise present in said bandwidth exceeds a predetermined threshold.

* * * * *